United States Patent [19]
McCollum

[11] Patent Number: 5,859,562
[45] Date of Patent: Jan. 12, 1999

[54] PROGRAMMING CIRCUIT FOR ANTIFUSES USING BIPOLAR AND SCR DEVICES

[75] Inventor: John L. McCollum, Saratoga, Calif.

[73] Assignee: Actel Corporation, Sunnyvale, Calif.

[21] Appl. No.: 772,813

[22] Filed: Dec. 24, 1996

[51] Int. Cl.[6] .................................................. G11C 17/08
[52] U.S. Cl. ........................... 327/525; 365/96; 365/225.7
[58] Field of Search ............................... 327/525; 365/96, 365/225.7

[56] References Cited

U.S. PATENT DOCUMENTS

| | | | |
|---|---|---|---|
| 3,634,929 | 1/1972 | Yoshida et al. | 29/577 |
| 3,699,403 | 10/1972 | Boleky, III | 317/235 |
| 4,122,547 | 10/1978 | Schroeder et al. | 365/189 |
| 4,146,902 | 3/1979 | Tanimoto et al. | 357/6 |
| 4,210,996 | 7/1980 | Amemiya et al. | 29/610 |
| 4,491,857 | 1/1985 | McElroy | 357/23 |
| 4,562,639 | 1/1986 | McElroy | 29/584 |
| 4,605,872 | 8/1986 | Rung | 307/465 |
| 4,698,589 | 10/1987 | Blankership et al. | 324/158 |
| 4,716,547 | 12/1987 | Baskett et al. | 365/96 |
| 4,718,042 | 1/1988 | Moll et al. | 365/201 |
| 4,814,853 | 3/1989 | Uchida | 357/51 |
| 4,874,711 | 10/1989 | Hughes et al. | 437/8 |
| 4,891,683 | 1/1990 | Chua | 357/38 |
| 4,899,205 | 2/1990 | Hamdy et al. | 357/51 |
| 4,947,060 | 8/1990 | Hoberman et al. | 307/467 |
| 5,008,855 | 4/1991 | Eltoukhy et al. | 365/96 |
| 5,095,362 | 3/1992 | Roesner | 357/23.4 |
| 5,126,282 | 6/1992 | Chiang et al. | 437/172 |
| 5,130,777 | 7/1992 | Galbraith et al. | 357/51 |

(List continued on next page.)

FOREIGN PATENT DOCUMENTS

| | | | |
|---|---|---|---|
| 0 457 463 | 11/1991 | European Pat. Off. | H01L 23/525 |
| 0 489 570 | 6/1992 | European Pat. Off. | G11C 17/18 |
| 0 493 957 | 7/1992 | European Pat. Off. | G11C 17/16 |
| 0 603 105 | 6/1994 | European Pat. Off. | H01L 23/525 |
| 0 626 726 | 11/1994 | European Pat. Off. | H01L 23/525 |
| 5-343633 | 3/1994 | Japan | H01L 27/10 |
| 6-318864 | 11/1994 | Japan | H03K 19/173 |
| 93/03497 | 2/1993 | WIPO | H01L 21/70 |
| 94/05086 | 3/1994 | WIPO | H03K 19/173 |

OTHER PUBLICATIONS

Gordon, et al., "Conducting Filament of the Programmed Metal Electrode Amorphous Silicon Antifuse", 1993, IEEE, IEDM 93, pp. 27–30.

*Primary Examiner*—Toan Tran
*Assistant Examiner*—An T. Luu
*Attorney, Agent, or Firm*—D'Alessandro & Ritchie

[57] ABSTRACT

The area of the switching devices for programming metal-to-metal antifuses can be drastically reduced by employing bipolar devices or the bipolar effects of SCR type switches to pass large currents while utilizing the minimum amount of die area. The switching devices may be formed in both p-type and n-type substrates. In a first antifuse programming structure fabricated on a p-type substrate, an NPN bipolar transistor is used as a pullup device and an SCR is used as a pulldown device. In a second antifuse programming structure, SCR devices are used as both pullup and pulldown devices. In a third antifuse programming structure fabricated on a p-type substrate, an NPN bipolar transnsistor is used as a pullup device and a PNP bipolar transistor is used as a pulldown device. In a fourth antifuse programming structure fabricated on a p-type substrate, an NPN bipolar transistor is used as a pullup device and a N-channel MOS transistor is used as a pulldown device. In a fifth antifuse programming structure fabricated on a p-type substrate, a PNP bipolar transistor is used as a pullup device and an SCR is used as a pulldown device. In a sixth antifuse programming structure fabricated on a p-type substrate, an MOS transistor is used as a pullup device and an SCR is used as a pulldowu device. In a seventh antifuse programming structure fabricated on a n-ype substrate, an SCR is used as a pullup device and an N-channel MOS transistor is used as a pulldown device. In a eighth antifuse programming structure fabricated on a n-type substrate, an NPN bipolar transistor is used as a pullup device and a N-channel MOS transistor is used as a pulldown device.

4 Claims, 8 Drawing Sheets

U.S. PATENT DOCUMENTS

| | | | |
|---|---|---|---|
| 5,134,457 | 7/1992 | Hamdy et al. | 357/51 |
| 5,166,556 | 11/1992 | Hsu, et al. | 307/465 |
| 5,194,759 | 3/1993 | El-Ayat, et al. | 307/202.1 |
| 5,200,920 | 4/1993 | Norman et al. | 365/185 |
| 5,237,219 | 8/1993 | Cliff | 307/465 |
| 5,243,226 | 9/1993 | Chan | 307/465 |
| 5,245,576 | 9/1993 | Foss et al. | 365/200 |
| 5,257,222 | 10/1993 | Lee | 365/96 |
| 5,257,225 | 10/1993 | Lee | 365/185 |
| 5,258,953 | 11/1993 | Tsujimoto | 365/200 |
| 5,262,994 | 11/1993 | McClure | 365/200 |
| 5,270,251 | 12/1993 | Cohen | 437/173 |
| 5,272,388 | 12/1993 | Bakker | 307/202.1 |
| 5,293,133 | 3/1994 | Birkner et al. | 324/713 |
| 5,293,339 | 3/1994 | Suzuki et al. | 365/200 |
| 5,294,846 | 3/1994 | Paivinen | 307/465 |
| 5,299,151 | 3/1994 | Ishihara et al. | 365/96 |
| 5,299,152 | 3/1994 | Ishihara et al. | 365/96 |
| 5,302,546 | 4/1994 | Gordon et al. | 437/170 |
| 5,314,840 | 5/1994 | Schepis et al. | 437/194 |
| 5,316,971 | 5/1994 | Chiang et al. | 437/170 |
| 5,327,024 | 7/1994 | Cox | 307/465 |
| 5,341,043 | 8/1994 | McCollum | 307/465 |
| 5,371,414 | 12/1994 | Galbraith | 327/525 |
| 5,390,141 | 2/1995 | Cohen et al. | 365/96 |
| 5,397,939 | 3/1995 | Gordon et al. | 326/38 |
| 5,414,364 | 5/1995 | McCollum | 324/550 |
| 5,416,355 | 5/1995 | Kudoh | 257/529 |
| 5,444,290 | 8/1995 | Paz De Araujo et al. | 257/530 |
| 5,448,184 | 9/1995 | Paivinen | 326/38 |
| 5,448,187 | 9/1995 | Kowalski | 326/81 |
| 5,469,077 | 11/1995 | Cox | 326/38 |
| 5,469,109 | 11/1995 | Paivinen | 327/525 |
| 5,469,379 | 11/1995 | Levy | 365/96 |
| 5,471,154 | 11/1995 | Gordon et al. | 326/38 |
| 5,477,167 | 12/1995 | Chua | 326/41 |
| 5,485,032 | 1/1996 | Schepis et al. | 257/530 |
| 5,485,105 | 1/1996 | Harward et al. | 326/38 |
| 5,495,181 | 2/1996 | Kolze | 326/38 |
| 5,495,436 | 2/1996 | Callahan | 365/96 |
| 5,502,395 | 3/1996 | Allen | 324/713 |
| 5,514,980 | 5/1996 | Pilling et al. | 326/38 |
| 5,525,909 | 6/1996 | McCollum | 324/550 |
| 5,544,070 | 8/1996 | Cox et al. | 364/489 |
| 5,548,225 | 8/1996 | Rountree et al. | 326/13 |
| 5,552,743 | 9/1996 | Manning | 327/567 |
| 5,572,458 | 11/1996 | Smith et al. | 365/96 |
| 5,590,085 | 12/1996 | Yuh et al. | 365/230.03 |
| 5,600,262 | 2/1997 | Kolze | 326/38 |
| 5,631,862 | 5/1997 | Cutter et al. | 365/96 |
| 5,635,854 | 6/1997 | Shimanek et al. | 326/38 |
| 5,661,323 | 8/1997 | Choi et al. | 257/378 |

PROGRAMMING CIRCUIT FOR ANTIFUSES USING BIPOLAR AND SCR DEVICES

BACKGROUND OF THE INVENTION

1. Field of the Invention

The present invention relates to antifuses and to structures and methods for programming antifuses. More particularly, the present invention relates to programming of antifuses using silicon controlled rectifier (SCR) and bipolar transistor structures.

2. The Prior Art

Amorphous silicon is commonly employed as the antifuse material in antifuses. Antifuses employing amorphous silicon antifuse layers require high programming currents (on the order of 15 to 30 mA or more) to prevent the programmed antifuse from later switching back to its off state. Prior art integrated circuits employing amorphous silicon antifuses employ large-area MOS transistors on the integrated circuit die in order to supply the high programming currents necessary for use in programming such antifuses. In these prior art integrated circuits, a first MOS transistor is a pull-up transistor having a source/drain region connected to a first electrode of the antifuse so that a programming voltage can be placed on that electrode, and a second MOS transistor is a pull-down transistor having a source/drain region connected to a second electrode of the antifuse so that an intermediate or ground voltage can be placed on that electrode.

In integrated circuits such as field programmable gate array integrated circuits containing large numbers (thousands to hundreds of thousands) of antifuses, the die area cost of providing the number of necessary MOS programming transistors is significant. As such arrays increase in size and density, the additional area required to provide programming transistors also increases. Die size limitations due to defect density will serve to limit the size of arrays which can be economically manufactured.

It would therefore be advantageous to provide small-area switching devices for use in amorphous silicon antifuse arrays which are capable of supplying the current necessary to program amorphous silicon antifuses. An object of the present invention is to therefore provide small-area switching devices for use in amorphous silicon antifuse arrays which are capable of supplying the current necessary to program amorphous silicon antifuses.

BRIEF DESCRIPTION OF THE INVENTION

According to the present invention, the area of the switching devices used can be drastically reduced by employing bipolar devices or the bipolar effects of SCR type switches to pass large currents while utilizing the minimum amount of die area.

According to a first embodiment of the present invention fabricated on a p-type substrate, an NPN bipolar transistor is used as a pullup device and an SCR is used as a pulldown device to program an antifuse.

According to a second embodiment of the present invention, SCR devices are used as both pullup and pulldown devices to program an antifuse. The additional SCR pullup device is fabricated at the cost of additional diffused regions.

According to a third embodiment of the present invention fabricated on a p-type substrate, an NPN bipolar transistor is used as a pullup device and a PNP bipolar transistor is used as a pulldown device to program an antifuse.

According to a fourth embodiment of the present invention fabricated on a p-type substrate, an NPN bipolar transistor is used as a pullup device and a N-channel MOS transistor is used as a pulldown device to program an antifuse.

According to a fifth embodiment of the present invention fabricated on a p-type substrate, a PNP bipolar transistor is used as a pullup device and an SCR is used as a pulldown device to program an antifuse.

According to a sixth embodiment of the present invention fabricated on a p-type substrate, an MOS transistor is used as a pullup device and an SCR is used as a pulldown device to program an antifuse.

According to a seventh embodiment of the present invention fabricated on a n-type substrate, an SCR is used as a pullup device and an N-channel MOS transistor is used as a pulldown device to program an antifuse.

According to an eighth embodiment of the present invention fabricated on a n-type substrate, an NPN bipolar transistor is used as a pullup device and a N-channel MOS transistor is used as a pulldown device to program an antifuse.

The switching devices of the antifuse programming architecture of the present invention may be provided on the integrated circuit by adding a few additional diffusions to the CMOS manufacturing process. This will increase the cost of the process somewhat but the reduction in area of the programming switches more than compensates for the additional cost.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Several embodiments of an antifuse programming circuit according to the present invention are described herein. Each of these embodiments improve over the present structures in the art for programming metal-to-metal antifuses by the bipolar effects of SCR's and/or bipolar transistors. The embodiments described herein employ devices formed in both p-type and n-type substrates.

Figure 1A:
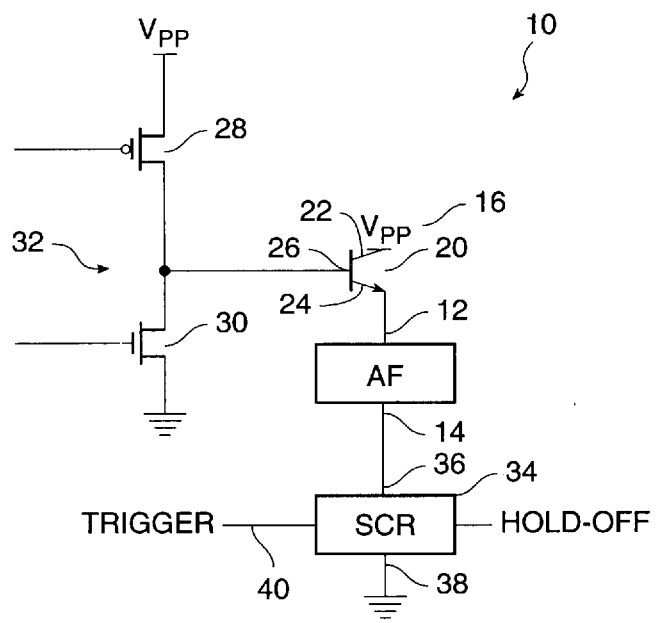
FIG. 1A is a schematic diagram of an antifuse programming architecture according to a first embodiment of the present invention comprising a NPN bipolar pullup transistor and an SCR pulldown device.
Figure 1B:
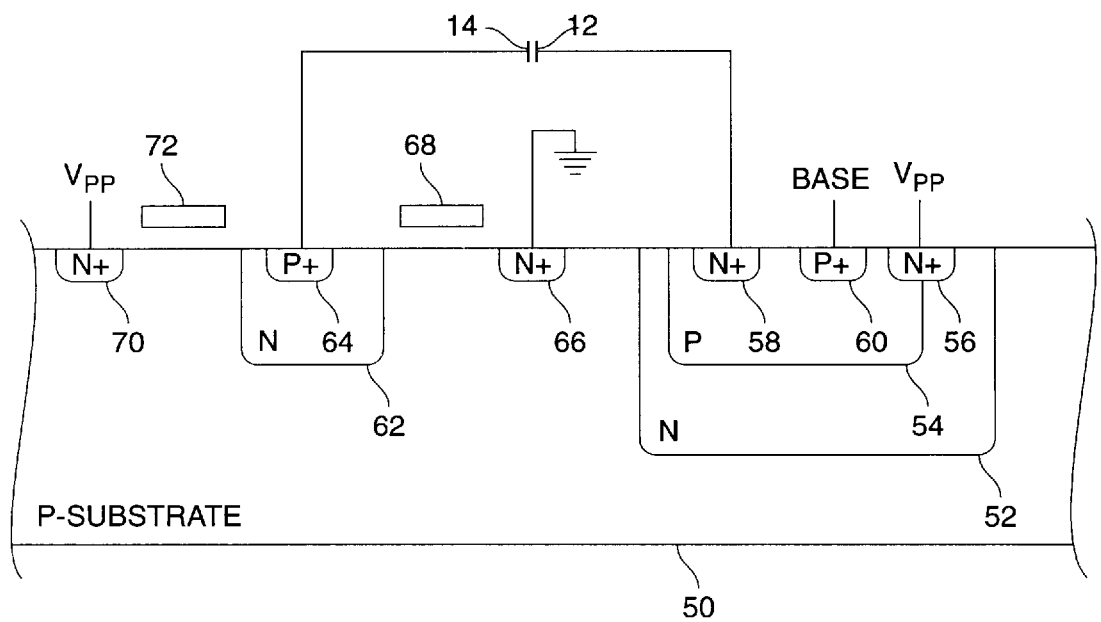
FIG. 1B is a cross sectional view of the antifuse programming architecture shown in FIG. 1A.

A first embodiment according to the present invention is depicted in FIGS. 1A and 1B. The antifuse programming circuit 10 according to the first embodiment of the present invention is shown in FIG. 1A in schematic diagram form, and in FIG. 1B in cross-sectional view.

In FIG. 1A, an antifuse to be programmed has a first electrode 12 and a second electrode 14. A first programming potential is shown at reference numeral 16 and a second programming potential is shown at reference numeral 18. First programming potential 16 is shown as Vpp and second programming potential 18 is shown as ground, the difference between potentials 16 and 18 being Vpp. A bipolar NPN transistor 20 has its collector 22 coupled to the first programming potential 16 and its emitter 24 coupled to first electrode 12 of the antifuse.

The base 26 of NPN bipolar transistor 20 is connected to the common drain node of P-channel MOS transistor 28 and N-channel MOS transistor 30. The gates of P-channel MOS transistor 28 and N-channel MOS transistor 30 are connected together. The source of N-channel MOS transistor 28 is connected to ground and the source of P-channel MOS transistor 30 is connected to Vpp. Those of ordinary skill in the art will readily recognize the configuration of P-channel MOS transistor 28 and N-channel MOS transistor 30 to be that of a conventional CMOS inverter 32.

An SCR 34 has an anode 36 coupled to the second electrode 14 of the antifuse, a cathode 38 coupled to ground, and a control terminal 40 coupled to an enable signal source. Though not part of the SCR 34, a gate 42 to hold-off or guarantee the SCR 34 is shut down is also shown in FIG. 1A.

In FIG. 1b, a cross-sectional view of a portion of a semiconductor substrate is presented showing an illustrative layout for the antifuse programming circuit 10 of FIG. 1A.

As illustrated in FIG. 1B, antifuse programming circuit 10 is fabricated on a p-type substrate 50. In CMOS design the most commonly used substrate is p-type using an n-well based design. To form the NPN bipolar transistor 20, a first n-well 52 is disposed in the p-type substrate 50. A p-type region 54 is formed in first n-well 52, and an N+ region 56 straddles the edge of p-type region 54 and first n-well 52. P-type region 54 also has formed therein an N+ region 58 and a P+ contact region 60. A lateral NPN transistor is formed by N+ region 58, p-type region 54, and N+ region 56 as the collector, base, and emitter, respectively, with P+ region 60 comprising a base contact. N+ region 56 is biased at Vpp to bias both first n-well 52 and N+ region 56 that voltage. P+ base contact region 62 is connected to the output of the inverter 32 (not shown in FIG. 1B).

To form the SCR device, a second n-well 62 is disposed in p-type substrate 50, a P+ region 64 is disposed in second n-well 62, and a first N+ region 66 is spaced apart from second n-well 62 on a first side to form a channel over which gate 68 forming the trigger of the SCR is disposed. A second N+ region 70 is spaced apart from second n-well 62 on a second side to form a channel over which gate 72 is disposed.

The inverter 32 is connected to the base of the NPN bipolar transistor 20 and is used to turn the NPN bipolar transistor 20 off and on. When the output of the inverter 32 is HIGH, the NPN bipolar transistor 20 is turned on and will source Vpp to the first electrode 12 of the antifuse. When the output of the inverter 32 is LOW the NPN bipolar transistor 20 will be turned off.

Those of ordinary skill in the art will recognize that P+ contact region 64, second n-well 62, substrate 50 and N+ region 66 form SCR 34. When the gate 68 is HIGH, the trigger of the SCR is pulled low, thus turning on the SCR 34 and pulling the second electrode 14 of the antifuse to ground. When gate 72 is LOW and the gate 72 is pulled one V+ above the voltage of the N-well 62, the N-well 62 will be charged to either Vcc or Vpp (depending whether it is in program mode or normal function mode) thereby guaranteeing that the SCR 34 is off.

The antifuse programming circuit of FIGS. 1A and 1B enjoys several advantages over conventional MOS transistor antifuse programming circuits. The first of these advantages is its smaller size. For the antifuse programming circuit 10 to provide a typical current of 25 mA, the antifuse programming circuit as shown in FIGS. 1A and 1B can be fabricated in an integrated circuit using less die area than a comparable MOS transistor antifuse programming circuit in order to provide the same programming current. The size of P-channel MOS transistor 28 in inverter 32 may also be reduced, because P-channel MOS transistor 28 need only supply adequate base current to NPN Bipolar transistor 20. Also the device shown in FIGS. 1A and 1B is being fabricated on a standard p-type substrate 50.

Figure 2A:
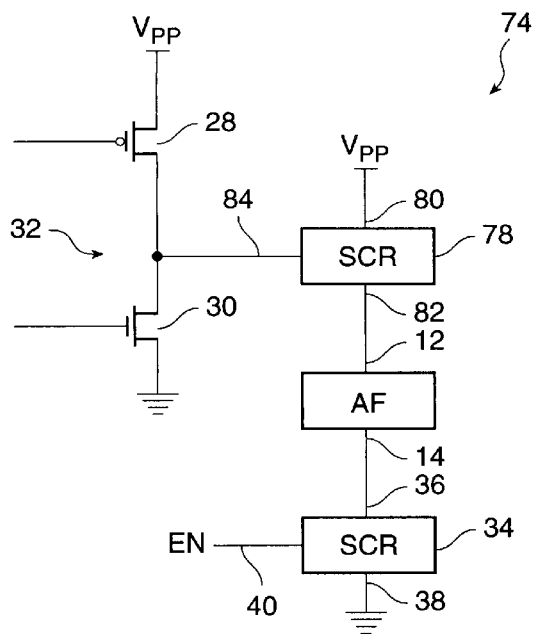
FIG. 2A is a schematic diagram of an antifuse programming architecture according to a second embodiment of the present invention employing both SCR pullup and pulldown devices.
Figure 2B:
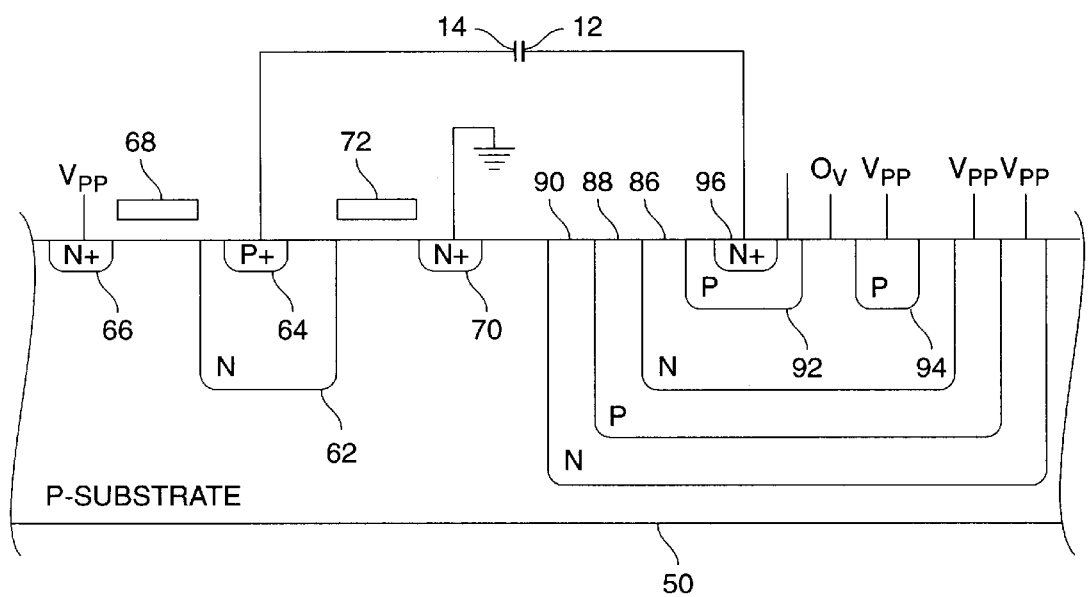
FIG. 2B is a cross sectional view of the antifuse programming architecture shown in FIG. 2A.

A second embodiment of an antifuse programming circuit 74 according to the present invention is depicted in FIG. 2A in schematic diagram form, and in FIG. 2B in cross-sectional view. The second embodiment differs from the first embodiment in that an SCR is used as a pull-up device instead of the NPN bipolar transistor 20 of FIG. 1A. To avoid unnecessary duplication of reference numerals, elements in the second embodiment which correspond to elements of the first embodiment are given the same reference numerals in both figures.

In FIG. 2A, an SCR device 78 is depicted as a pull-up device in the antifuse programming circuit 74. SCR device 78 has an anode 80 connected to the first programming potential 16, a cathode 82 coupled to first electrode 12 of the antifuse, and an enable input 84 connected to the output of inverter 32. The SCR device 34 is as described with reference to FIGS. 1A and 1B.

In FIG. 2B, the SCR device 78 is shown formed in an n-well 86. N-well 86 is disposed in insulating p-well 88, that is in turn disposed in an insulating n-well 90. This series of insulating wells is disposed in p-type substrate 50. Insulating p-well 88, insulating n-well 90, and the insulating junctions formed thereby may be eliminated if the circuit of the present invention is fabricated in silicon-on-insulator (SOI) in a manner well known in the art.

To form the SCR device 78, first and second p-wells 92 and 94 are disposed in n-well 86, and an N+ contact region 96 is disposed in first p-well 92. The SCR device 78 comprises second p-well 94, n-well 86, first p-well 92, and N+ contact region 96. Second p-well 94 is the anode 80 of the SCR device 78 coupled to the first programming potential, Vpp. N+ contact region 96 is the cathode 82 of the SCR device 78 coupled to the first electrode 12 of the antifuse. The n-well 86 is connected to 0 volts to forward bias the junction between second p-well 94 and n-well 86. The output of inverter 32 is coupled to the first p-well 92 as the enable input 84 of the SCR 78.

Inverter 32, well known to those of ordinary skill in the art was described in reference to FIG. 1A. When the output of inverter 32 is HIGH (Vpp), the junction between first p-well 92 and N+ contact region 86 is forward biased so that the programming voltage is placed on the electrode 12 of the antifuse and current is sourced through Vpp connected to second p-well 88. SCR device 34, described in the first embodiment with reference to FIGS. 1A and 1B, operates as described therein to place a ground potential on the antifuse electrode 14. When the output of inverter 32 is LOW (0 Volts), SCR device 78 is in an off state.

The second embodiment of the invention depicted in FIGS. 2A and 2B also has the advantage of reducing the size of the antifuse programming circuit in comparison to the prior art. Although this structure requires additional diffusions, very high current can be provided to the antifuse. As pointed out previously high current is needed to reliably program an antifuse.

Figure 3A:
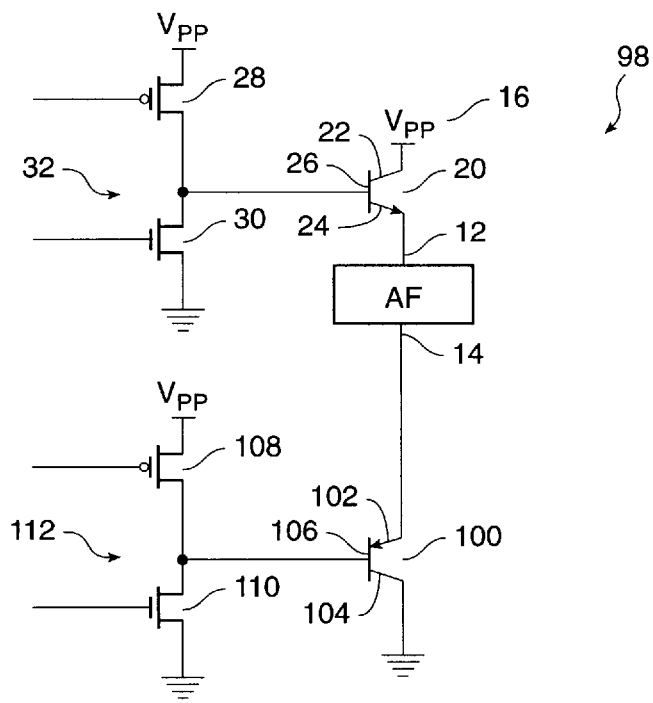
FIG. 3A is a schematic diagram of an antifuse programming architecture according to a third embodiment of the present invention comprising a NPN bipolar pullup transistor and a PNP bipolar pulldown transistor.
Figure 3B:
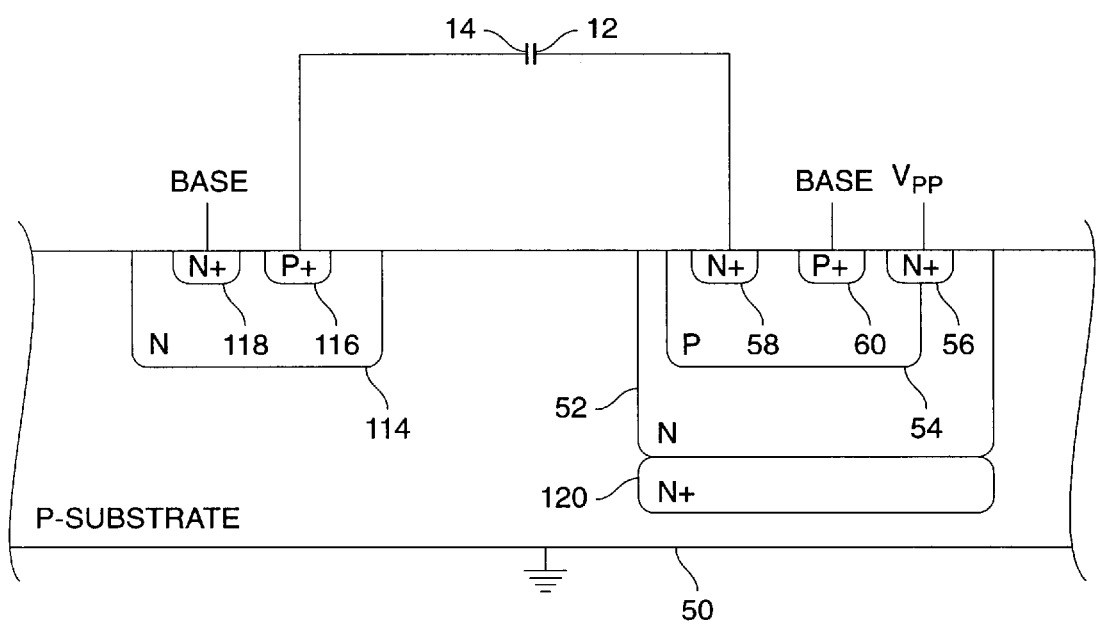
FIG. 3B is a cross sectional view of the antifuse programming architecture shown in FIG. 3A.

A third embodiment of an antifuse programming circuit 96 according to the present invention is depicted in FIG. 3A in schematic diagram form, and in FIG. 3B in cross-sectional view. The third embodiment differs from the first embodiment in that a PNP bipolar transistor is used as a pull-down device instead of the SCR device 34 of FIG. 1A. To avoid unnecessary duplication of reference numerals, elements in the third embodiment which correspond to elements of the first embodiment are given the same reference numerals in both figures.

In FIG. 3A, the pull-up NPN bipolar transistor 20 and inverter 32 are as described above with regard to FIGS. 1A and 1B. The NPN bipolar transistor 20 has one additional feature not shown in the cross-sectional view of FIG. 1B. The NPN bipolar transistor 20 of FIGS. 3A and 3B has an N+ layer 120 buried beneath n-well 52. The buried N+ layer 120 in the collector 22 of NPN bipolar transistor 20 improves the current sourcing ability of NPN bipolar transistor 20.

The pull-down device of the antifuse programming circuit 98 is a PNP bipolar transistor 100 with an emitter 102 coupled to the second electrode 14 of the antifuse, and a collector 104 coupled to ground. The base 106 of PNP bipolar transistor 100 is connected to the common drain node of P-channel MOS transistor 108 and N-channel MOS transistor 110. The gates of P-channel MOS transistor 108 and N-channel MOS transistor 110 are connected together. The source of N-channel MOS transistor 110 is connected to ground and the source of P-channel MOS transistor 108 is connected to Vpp. Those of ordinary skill in the art will readily recognize the configuration of P-channel MOS transistor 108 and N-channel MOS transistor 110 to be that of a conventional CMOS inverter 112.

As shown in the cross-sectional view of FIG. 3B, PNP bipolar pull-down transistor 100 is formed as n-well 114 disposed in p-type substrate 50, and a P+ region 116 disposed in n-well 114. The emitter 102, collector 104 and base 106 of the PNP bipolar transistor 100 are the P+ region 116, the p-type substrate 50, and n-well 114. An N+ contact region 118 is formed in n-well 114. PNP bipolar transistor 100 is triggered by inverter 112 to pull down the antifuse electrode 14 to ground.

The PNP bipolar transistor 100 is nearly as efficient as the SCR device 34 of FIGS. 1A and 1B. Only slightly more current drive need be supplied to the base of PNP bipolar transistor 100 to obtain the desired current for antifuse programming.

Figure 4A:
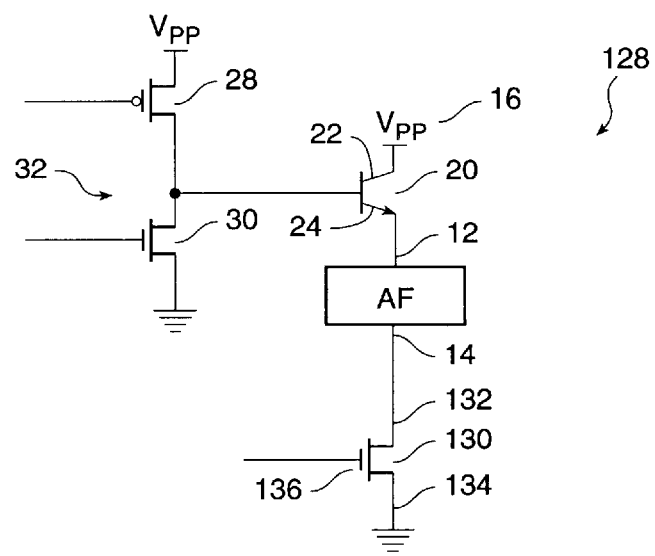
FIG. 4A is a schematic diagram of an antifuse programming architecture according to a fourth embodiment of the present invention fabricated in a p-type substrate comprising an NPN bipolar pullup transistor and an N-channel MOS pulldown transistor.
Figure 4B:
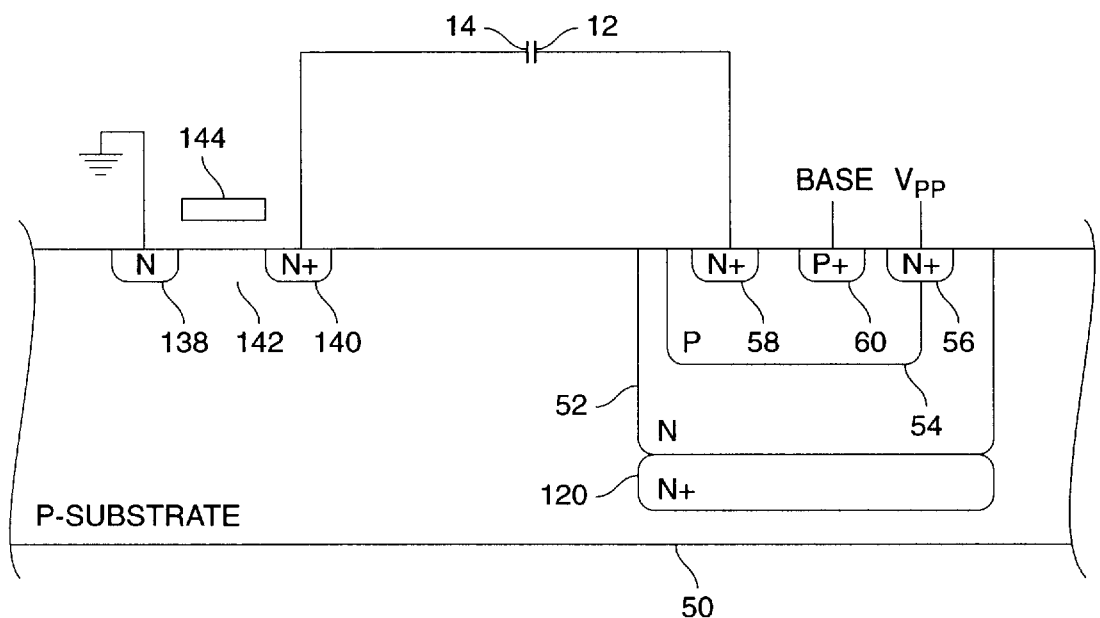
FIG. 4B is a cross sectional view of the antifuse programming architecture shown in FIG. 4A.

A fourth embodiment of an antifuse programming circuit 128 according to the present invention is depicted in FIG. 4A in schematic diagram form, and in FIG. 4B in cross-sectional view. The fourth embodiment differs from the third embodiment in that an N-channel MOS transistor is used as a pull-down device instead of the PNP bipolar transistor of FIGS. 3A and 3B. To avoid unnecessary duplication of reference numerals, elements in the third embodiment which correspond to elements of the first embodiment are given the same reference numerals in both figures.

In FIG. 4A, N-channel MOS transistor 130 has a drain 132, coupled to the second electrode 14 of the antifuse, a source 134 coupled to ground, and a gate 136 coupled to an enable signal. The pull-up NPN bipolar transistor 20 and inverter 32 are as described above with regard to FIGS. 1A and 1B.

As shown in the cross-sectional view of FIG. 4B, N-channel MOS transistor 130 has first and second n-type diffusions 138 and 140 spaced apart to form a channel 142. A gate is 144 is formed over the channel region 142 as is conventional in the art. The first n-type diffusion 138 is coupled to ground and forms the source of N-channel MOS transistor 130. The second n-type diffusion 140 is coupled to the antifuse electrode 14 and forms the drain of N-channel MOS transistor 130.

N-channel MOS transistor 130 is triggered by an enable signal. When a signal is applied to the gate 144 which is high enough to turn on N-channel MOS transistor 130, the antifuse electrode 14 is pulled down to ground. To program the antifuse, Vpp is placed on the first electrode of the antifuse 12 as described with reference to FIGS. 1A and 1B.

Although the current drive of the N-channel MOS transistor is not quite as efficient as the PNP bipolar transistor 100 depicted in FIGS. 3A and 3B, it has an advantage in that unlike the PNP bipolar transistor 100, there is no minority carrier injection into the substrate 50.

Figure 5A:
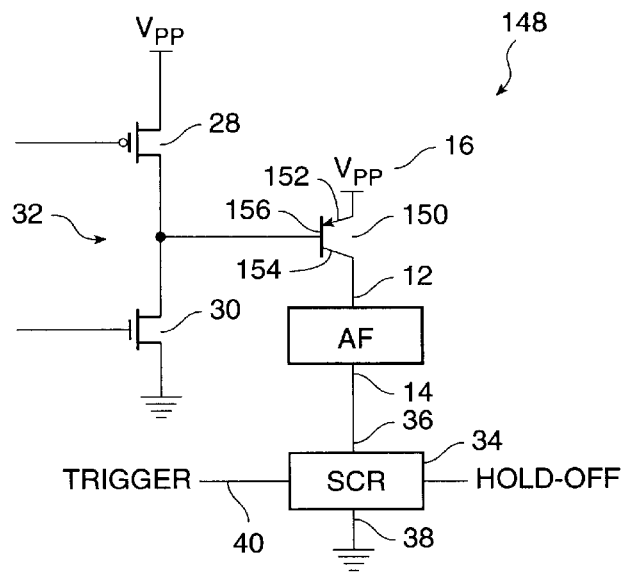
FIG. 5A is a schematic diagram of an antifuse programming architecture according to a fifth embodiment of the present invention comprising a PNP bipolar pullup transistor and an SCR pulldown device.
Figure 5B:
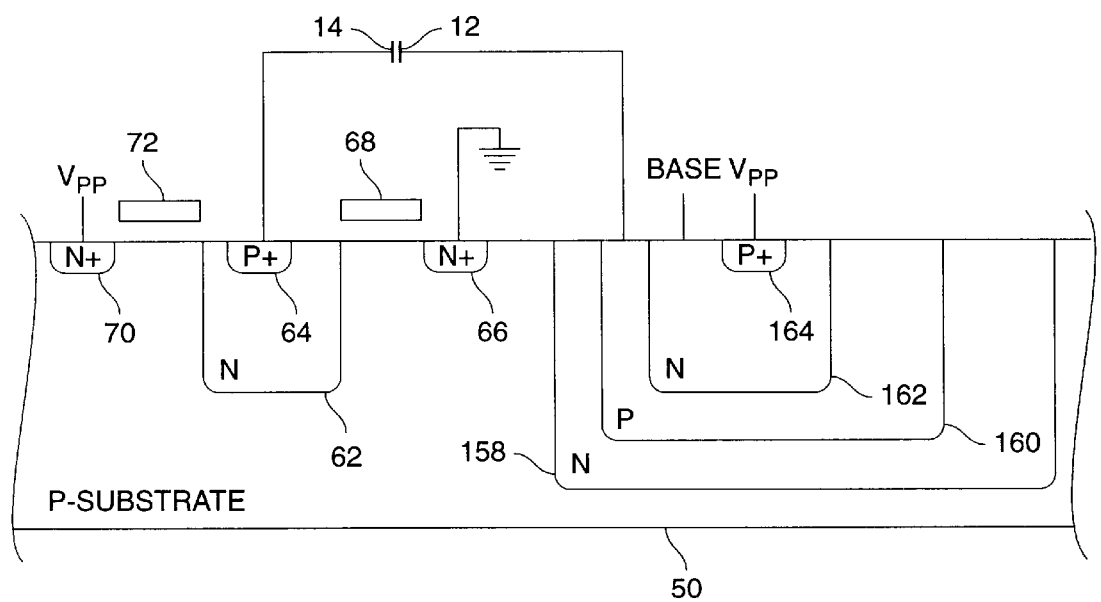
FIG. 5B is a cross sectional view of the antifuse programming architecture shown in FIG. 5A.

A fifth embodiment of an antifuse programming circuit 148 according to the present invention is depicted in FIG. 5A in schematic diagram form, and in FIG. 5B in cross-sectional view. The fifth embodiment differs from the first embodiment in that a PNP bipolar transistor is used as a pull-up device instead of the NPN bipolar transistor 20 of FIG. 1A. To avoid unnecessary duplication of reference numerals, elements in the fifth embodiment which correspond to elements of the first embodiment are given the same reference numerals in both figures.

In FIG. 5A, a bipolar PNP transistor 150 has an emitter 152 coupled to the first programming potential 16, a collector 154 coupled to the first electrode 12 of the antifuse, and a base 156 connected to the output of inverter 32. The SCR 34 and inverter 32 are as described with reference to FIGS. 1A and 1B.

In FIG. 5B, a cross-sectional view of a portion of a semiconductor substrate is presented showing an illustrative layout for the antifuse programming circuit 148 of FIG. 5A. The PNP transistor 150 is formed in an insulating n-well 158 disposed in the p-type substrate 50. The collector 154 of PNP bipolar transistor 150 is a p-well 160 formed in insulating n-well 158. The p-well 160 is connected to the electrode 12 of the antifuse. The base 156 of PNP bipolar transistor 150 is an n-well 162 formed in p-well 160. The n-well 162 is connected to the output of inverter 32. The emitter 152 of PNP bipolar transistor 150 is a P+ contact region 164 formed in n-well 164. The P+ contact region 164 is connected to Vpp. The SCR device 34 is formed as described with reference to FIGS. 1A and 1B.

The inverter 32 is connected to the base of the PNP bipolar pullup transistor 150 and is used to turn the transistor off and on. When the output of the inverter 32 is LOW, the base 156 of the PNP transistor is at ground and the first electrode 12 of the antifuse will be pulled up to Vpp. The SCR device 34 also operates as described with respect to FIGS. 1A and 1B.

One advantage of using a PNP bipolar transistor 150 instead of the NPN bipolar transistor 20 FIGS. 1A and 1B is that the base 156 of PNP bipolar transistor 150 does not have to be pulled up above Vpp. Hence, the driving voltage is lower and the circuit design is simpler.

A sixth embodiment of an antifuse programming circuit 168 according to the present invention is another variation of the invention shown in FIGS. 1A and 1B. In the sixth embodiment of the invention, an MOS transistor, either N-channel of P-channel is used as a pull-up device instead of the NPN bipolar transistor 20 of FIG. 1A. To avoid unnecessary duplication of reference numerals, elements in the sixth embodiment which correspond to elements of the first embodiment are given the same reference numerals in both figures.

Figure 6A:
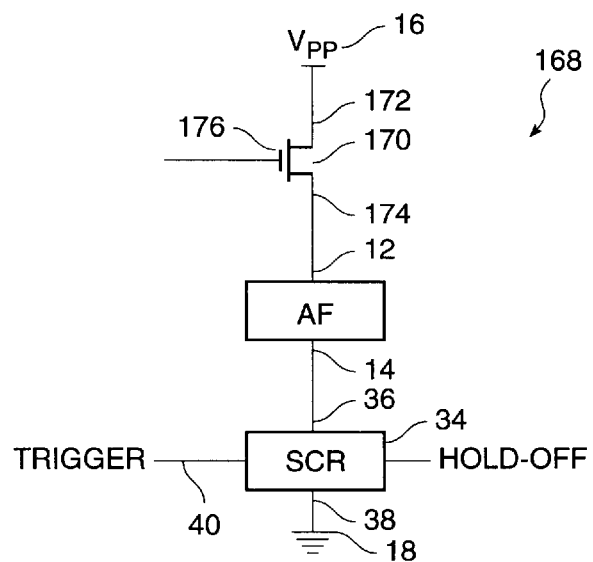
FIG. 6A is a schematic diagram of an antifuse programming architecture according to a sixth embodiment of the present invention comprising an MOS pullup transistor and an SCR pulldown device.

In a schematic illustration of the present invention shown FIG. 6A, an MOS transistor 170, either P-channel or N-channel, is depicted having a first source/drain region 172 coupled to the first programming potential 16, a second source/drain region 174 coupled to the first electrode 12 of the antifuse, and a base 176 connected to an enable signal. The SCR 34 is as described with reference to FIGS. 1A and 1B.

Figure 6B:
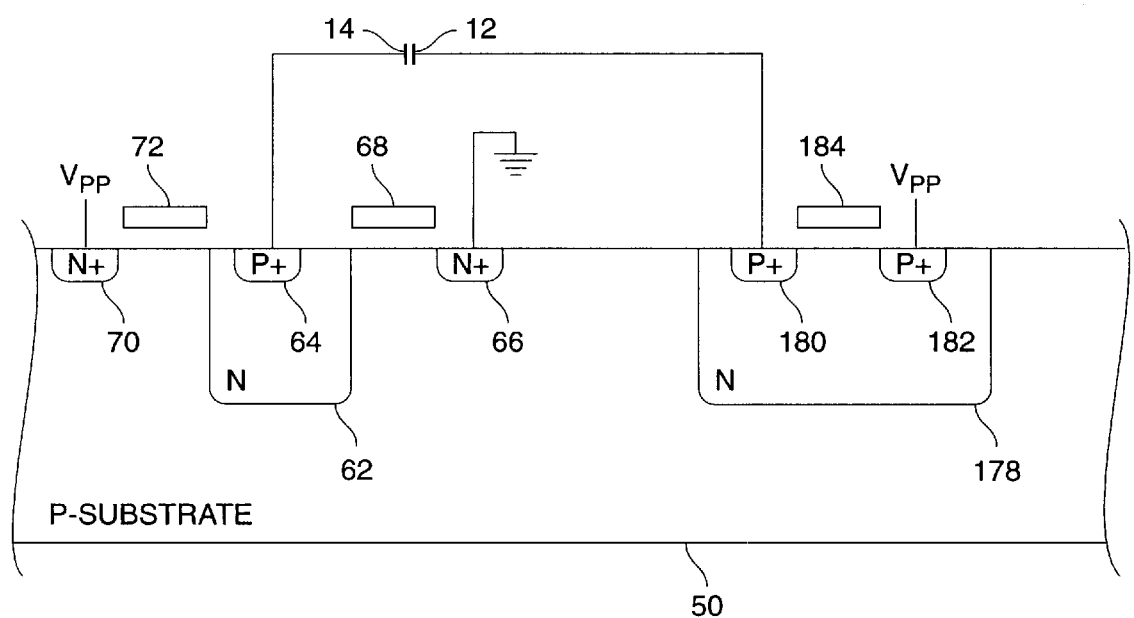
FIG. 6B is a cross sectional view of the antifuse programming architecture shown in FIG. 6A.

In FIG. 6B, a cross-sectional view of a portion of a semiconductor substrate is presented showing an illustrative layout for the antifuse programming circuit 168 of FIG. 6A. The MOS transistor 170 illustrated therein is a P-channel MOS transistor, though it could alternatively be an N-channel MOS transistor. The P-channel MOS transistor 170 is formed in an insulating n-well 178 disposed in the p-type substrate 50. The drain 174 of P-channel MOS transistor 170 is a P+ contact region 180 formed in n-well 178. The P+ contact region 180 is connected to the electrode 12 of the antifuse. The source 172 of P-channel MOS transistor 170 is a P+ contact region 182 formed in n-well 178. The P+ contact region 182 is connected to Vpp. The gate 184 of P-channel MOS transistor 170 is formed as is well known in the art, and is connected to an enable signal. The SCR device 34 is formed as described with reference to FIGS. 1A and 1B.

In an alternative embodiment using a N-channel MOS transistor 170, the n-well 178 is not formed and the contact regions 180 and 182 are N+ contact regions. In the N-channel MOS transistor 170 embodiment, N+ contact region 180 is the source 174 of N-channel MOS transistor 170, and N+ contact region is the drain 182 of N-channel MOS transistor 170. When MOS transistor 170 is a P-channel device, the MOS transistor 170 is turned on by a LOW signal as is well known in the art, and when MOS transistor 170 is an N-channel device, the MOS transistor 170 is turned on by a HIGH signal as is well known in the art. The SCR device 34 also operates as described with respect to FIGS. 1A and 1B.

Though the embodiments of FIGS. 6A and 6B represent an improvement over the prior art by reducing the area required by the antifuse programming circuit 10, the size reduction is not as great as that derived by the embodiments of FIGS. 1A and 1B due to the fact that using an MOS transistor 170 as the pull-up device has less current drive than a bipolar transistor or SCR device, or than an MOS transistor used as a pull-down device.

Figure 7A:
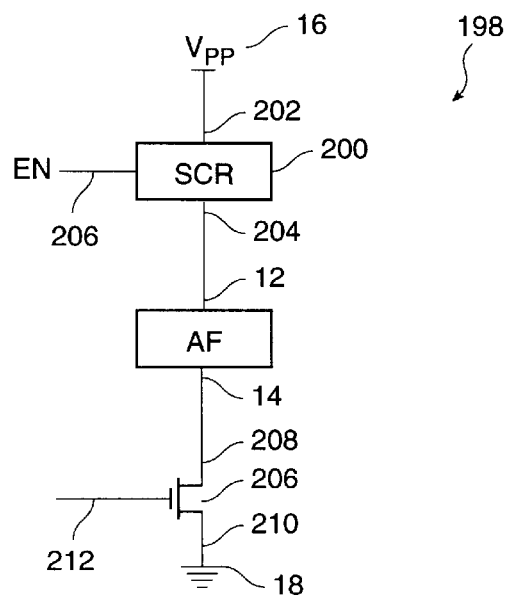
FIG. 7A is a schematic diagram of an antifuse programming architecture according to a seventh embodiment of the present invention comprising an SCR pullup device and an N-channel MOS pulldown transistor.
Figure 7B:
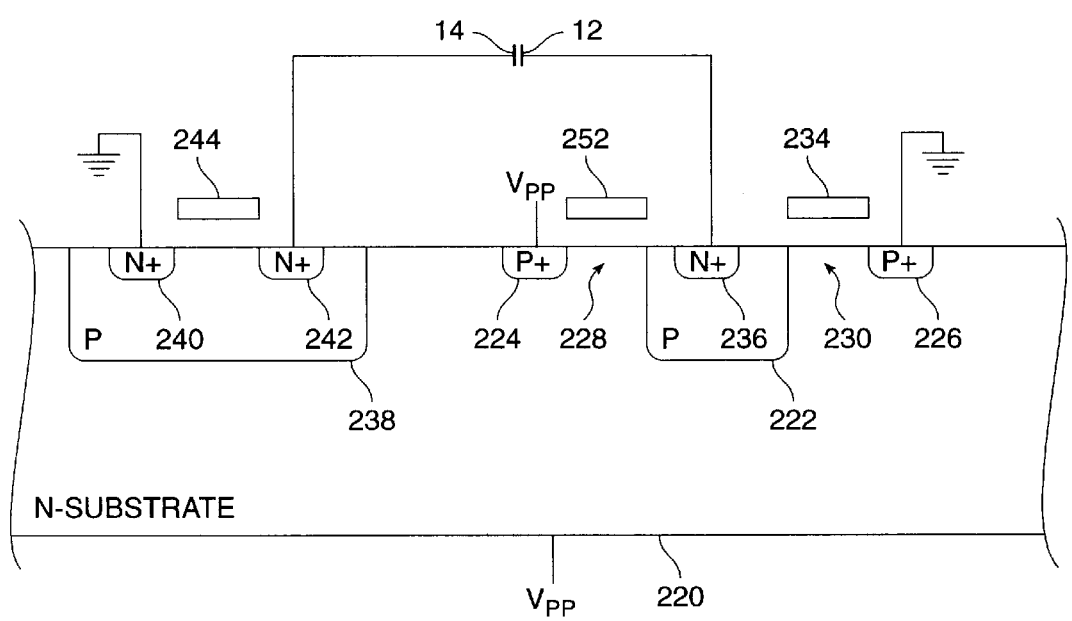
FIG. 7B is a cross sectional view of the antifuse programming architecture shown in FIG. 7A.

A seventh embodiment according to the present invention is depicted in FIGS. 7A and 7B. The antifuse programming circuit 198 according to the seventh embodiment of the present invention is shown in FIG. 7A in schematic diagram form, and in FIG. 7B in cross-sectional view.

In FIG. 7A, an antifuse to be programmed has a first electrode 12 and a second electrode 14. A first programming potential is shown at reference numeral 16 and a second programming potential is shown at reference numeral 18. First programming potential 16 is shown as Vpp and second programming potential 18 is shown as ground, the difference between potentials 16 and 18 being Vpp.

An SCR 200 has an anode 202 coupled to the first programming potential 16, a cathode 204 coupled to the first electrode 12 of the antifuse, and a gate or control terminal 206 coupled to an enable signal source. An N-channel MOS transistor has a drain 208 connected to the second electrode 14 of the antifuse, a source 210 connected to the second programming potential 18, and a gate connected to an enable signal.

In FIG. 7B, a cross-sectional view of a portion of a semiconductor substrate is presented showing an illustrative layout for the antifuse programming circuit 10 of FIG. 7A. As illustrated in FIG. 7B, antifuse programming circuit 10 is fabricated on a n-type substrate 220 coupled to Vpp.

To form the SCR device 200, a p-well 222, and first and second P+ contact regions 224 and 226 are formed in n-type substrate 220. The first and second P+ contact regions are spaced apart from p-well 222 on either side to form first and second channels 228 and 230. First and second gates 232 and 234 are formed above channels 228 and 230, respectively, in a manner well known to those of ordinary skill in the art. An N+ region 64 is formed in p-well 222. First P+ contact region 224 as the anode 202 of SCR device 200 is coupled to first programming potential 16, Vpp. N+ region 236 as the cathode 204 of SCR device 200 is coupled to the first electrode 12 of the antifuse.

The N-channel MOS transistor 206 is formed in a p-well 238 disposed in the n-type substrate 220. First and second N+ contact regions 240 and 242 are disposed in the p-type well 238 to form the source 210 and drain 208, respectively, of N-channel MOS transistor 206 in a manner well known to those of ordinary skill in the art. First N+ contact region 240 as the source 210 of N-channel MOS transistor 206 is coupled to ground. Second N+ contact region 242 as the drain 208 of N-channel MOS transistor 206 is coupled to the second electrode 12 of the antifuse. First and second N+ contact regions 240 and 242 are spaced apart to form a channel over which a gate 244 is formed.

Those of ordinary skill in the art will recognize that the regions 236, 222, substrate 220 and region 224 form an SCR. When the gate 232 is LOW, the trigger of the SCR is pulled HIGH, thus turning on the SCR and pulling the first electrode 12 of the antifuse to Vpp. The second electrode 14 of the antifuse is pulled to ground by providing a HIGH signal to the gate of N-channel MOS transistor 206 to turn it on. To guarantee that the SCR is off when gate 232 is HIGH, the gate 234 is biased to V+ above Vpp.

The antifuse programming circuit of FIGS. 7A and 7B enjoys several advantages over conventional MOS transistor antifuse programming circuits. Like the other embodiments of the present invention described herein, one of these advantages is its smaller size. As a pull-up device the SCR 200 replaces the typically anemic MOS pull-up device, while the N-channel pull-down device is a very good driver. The seventh embodiment of the invention is also easy to implement in a standard n-substrate CMOS process, because the number of additional process steps is a minimum.

Figure 8A:
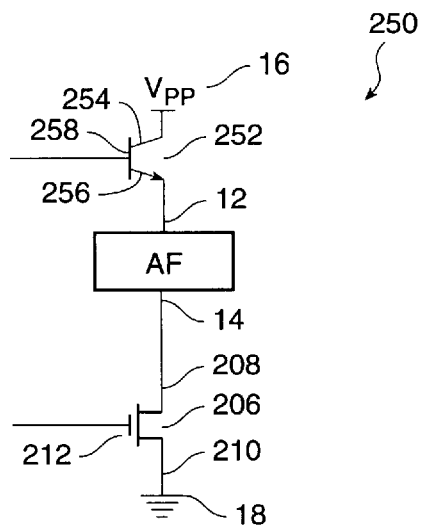
FIG. 8A is a schematic diagram of an antifuse programming architecture according to an eighth embodiment of the present invention fabricated in an n-type substrate comprising a NPN bipolar pullup transistor and an N-channel MOS pulldown transistor.
Figure 8B:
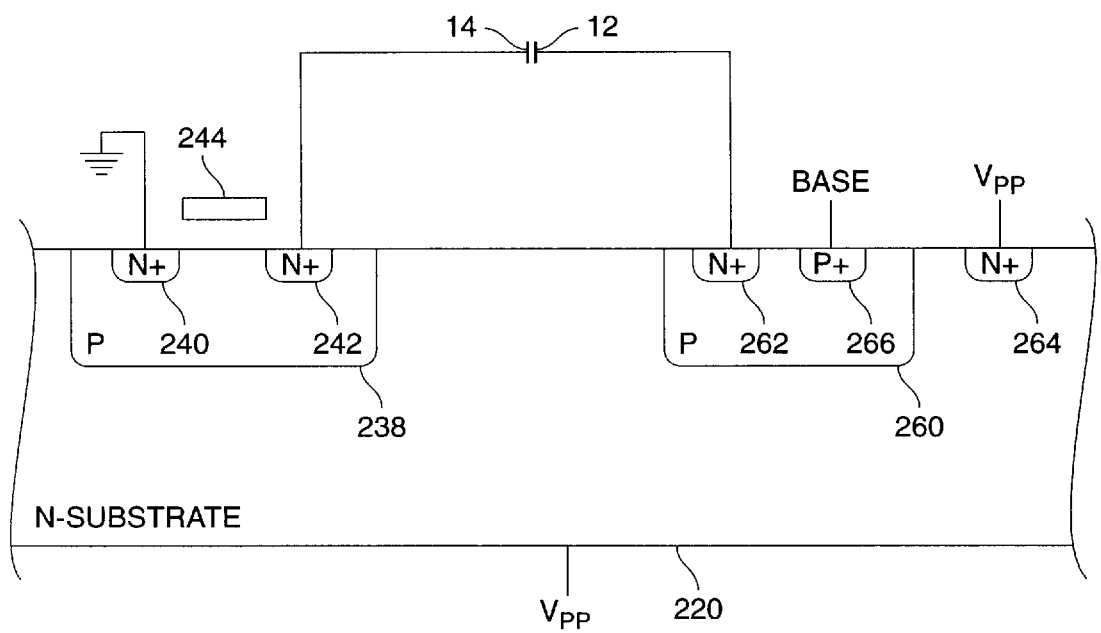
FIG. 8B is a cross sectional view of the antifuse programming architecture shown in FIG. 8A.

An eighth embodiment of an antifuse programming circuit 250 according to the present invention is shown in FIG. 8A in schematic diagram form, and in FIG. 8B in cross-sectional view. In the eighth embodiment of the invention, an NPN bipolar transistor is used as a pull-up device instead of the SCR device 200 of FIG. 7A. To avoid unnecessary duplication of reference numerals, elements in the eighth embodiment which correspond to elements of the seventh embodiment are given the same reference numerals in both figures.

In FIG. 8A, an antifuse to be programmed has a first electrode 12 and a second electrode 14. A first programming potential is shown at reference numeral 16 and a second programming potential is shown at reference numeral 18. First programming potential 16 is shown as Vpp and second programming potential 18 is shown as ground, the difference between potentials 16 and 18 being Vpp.

An NPN bipolar transistor 252 has a collector 254 coupled to the first programming potential 16, an emitter 256 coupled to the first electrode 12 of the antifuse, and a base 258 coupled to an enable signal source. An N-channel MOS transistor has a drain 208 connected to the second electrode 14 of the antifuse, a source 210 connected to the second programming potential 18, and a gate connected to an enable signal.

In FIG. 8B, a cross-sectional view of a portion of a semiconductor substrate is presented showing an illustrative layout for the antifuse programming circuit 250 of FIG. 7A. To form the NPN bipolar transistor 252, a p-well 260 is formed in n-type substrate 220. A first N+ contact region 262 is formed in p-well 260 and a second N+ contact region is formed outside p-well 262. Also disposed in p-well 260 is a P+ contact region 266. Second N+ contact region 264, p-well 260, P+ contact region 266, and first N+ contact region 262 form the collector 254, base 258, and emitter 256 of NPN bipolar transistor 252 as is well known in the art. The N-channel MOS transistor 238 is formed as described with reference to FIGS. 7A and 7B.

The antifuse is programmed by driving the base of NPN bipolar transistor to pull the first electrode 12 of the antifuse to Vpp, and putting a HIGH signal on N-channel MOS transistor 206 to pull the second electrode 14 of the antifuse to ground.

The antifuse programming circuit of FIGS. 8A and 8B enjoys the same advantages as the antifuse programming circuit of FIGS. 7A and 7B, except the NPN bipolar transistor needs somewhat more base drive.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for programming an antifuse in a CMOS integrated circuit comprising:
   a bipolar NPN transistor having a collector coupled to a first programming potential, a base coupled to a programming enable node, and an emitter coupled to a first electrode of an antifuse to be programmed;
   an SCR device having a first main terminal coupled to a second electrode of said antifuse to be programmed, a second main terminal coupled to a second programming potential lower than said first programming potential by an amount sufficient to program said antifuse to be programmed, and a control terminal coupled to said programming enable node.

2. A circuit for programming an antifuse in a CMOS integrated circuit comprising:
   a first SCR device having a first main terminal coupled to a first programming potential, a second main terminal coupled to a first electrode of an antifuse to be programmed, and a control terminal coupled to a programming enable node; and
   a second SCR device having a first main terminal coupled to a second electrode of said antifuse to be programmed, a second main terminal coupled to a second programming potential lower than said first programming potential by an amount sufficient to program said antifuse to be programmed, and a control terminal coupled to said programming enable node.

3. A circuit for programming an antifuse in a CMOS integrated circuit comprising:
   a bipolar PNP transistor having an emitter coupled to a first programming potential, a base coupled to a programming enable node, and a collector coupled to a first electrode of an antifuse to be programmed;
   an SCR device having a first main terminal coupled to a second electrode of said antifuse to be programmed, a second main terminal coupled to a second programming potential lower than said first programming potential by an amount sufficient to program said antifuse to be programmed, and a control terminal coupled to said programming enable node.

4. A circuit for programming an antifuse in a CMOS integrated circuit comprising:
   an MOS transistor having a first source/drain coupled to a first programming potential, a base coupled to a programming enable node, and a second source/drain coupled to a first electrode of an antifuse to be programmed;
   an SCR device having a first main terminal coupled to a second electrode of said antifuse to be programmed, a second main terminal coupled to a second programming potential lower than said first programming potential by an amount sufficient to program said antifuse to be programmed, and a control terminal coupled to said programming enable node.

* * * * *